(12) United States Patent
Zhang et al.

(10) Patent No.: US 11,170,863 B2
(45) Date of Patent: Nov. 9, 2021

(54) MULTI-BIT-PER-CELL THREE-DIMENSIONAL RESISTIVE RANDOM-ACCESS MEMORY (3D-RRAM)

(71) Applicant: Southern University of Science and Technology, ShenZhen (CN)

(72) Inventors: Guobiao Zhang, Corvallis, OR (US); Yida Li, ShenZhen (CN); Xiaodong Xiang, ShenZhen (CN); Hongyu Yu, ShenZhen (CN); Yuejin Guo, ShenZhen (CN); Shengming Zhou, ShenZhen (CN); Guoxing Zhang, ShenZhen (CN); Guangzhao Liu, ShenZhen (CN); Mingtao Hu, ShenZhen (CN); Wang Zhang, ShenZhen (CN); Mei Shen, ShenZhen (CN)

(73) Assignee: Southern University of Science and Technology, GuangDong (CN)

( * ) Notice: Subject to any disclaimer, the term of this patent is extended or adjusted under 35 U.S.C. 154(b) by 0 days.

(21) Appl. No.: 16/921,879

(22) Filed: Jul. 6, 2020

(65) Prior Publication Data

US 2020/0350030 A1    Nov. 5, 2020

Related U.S. Application Data

(63) Continuation-in-part of application No. 16/125,714, filed on Sep. 9, 2018, now Pat. No. 10,706,945, which
(Continued)

(30) Foreign Application Priority Data

Apr. 14, 2016 (CN) .......................... 201610238012.7
Aug. 2, 2018 (CN) .......................... 201810872935.7
Jan. 17, 2020 (CN) .......................... 202010052642.1

(51) Int. Cl.
*G11C 17/16* (2006.01)
*G11C 29/00* (2006.01)
(Continued)

(52) U.S. Cl.
CPC .............. *G11C 17/165* (2013.01); *G11C 7/14* (2013.01); *G11C 11/5692* (2013.01);
(Continued)

(58) Field of Classification Search
CPC .............. G11C 17/165; G11C 13/0002; G11C 13/0004; G11C 13/0069; G11C 2213/71; H01L 21/8221; H01L 25/00; H01L 27/281

See application file for complete search history.

(56) References Cited

U.S. PATENT DOCUMENTS

4,404,655 A   9/1983   Naiff
4,424,579 A   1/1984   Roesner
(Continued)

*Primary Examiner* — Alfredo Bermudez Lozada (57) ABSTRACT

The present invention discloses a multi-bit-per-cell three-dimensional resistive random-access memory (3D-$RRAM_{MB}$). It comprises a plurality of RRAM cells stacked above a semiconductor substrate. Each RRAM cell comprises a RRAM layer, which is switched from a high-resistance state to a low-resistance state during programming. By adjusting the programming current, the programmed RRAMs have different resistances.

6 Claims, 11 Drawing Sheets

Related U.S. Application Data is a continuation of application No. 15/488,435, filed on Apr. 14, 2017, now Pat. No. 10,102,917.

(51) Int. Cl.
*G11C 7/14* (2006.01)
*G11C 11/56* (2006.01)
*G11C 13/00* (2006.01)
*G11C 17/18* (2006.01)

(52) U.S. Cl.
CPC ........ *G11C 13/004* (2013.01); *G11C 13/0069* (2013.01); *G11C 17/16* (2013.01); *G11C 17/18* (2013.01); *G11C 29/78* (2013.01); *G11C 2013/0042* (2013.01); *G11C 2013/0054* (2013.01); *G11C 2013/0078* (2013.01); *G11C 2213/71* (2013.01); *G11C 2216/12* (2013.01)

(56) References Cited

U.S. PATENT DOCUMENTS

| | | |
|---|---|---|
| 4,598,386 A | 7/1986 | Roesner et al. |
| 4,603,341 A | 7/1986 | Bertin et al. |
| 4,646,266 A | 2/1987 | Ovshinsky et al. |
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |
| 5,825,686 A | 10/1998 | Schmitt-Landsiedel et al. |
| 5,835,396 A | 11/1998 | Zhang |
| 5,838,530 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,034,882 A | 3/2000 | Johnson et al. |
| 6,049,481 A | 4/2000 | Yamasaki |
| 6,055,180 A | 4/2000 | Gudesen et al. |
| 6,185,122 B1 | 2/2001 | Johnson et al. |
| 6,221,723 B1 | 4/2001 | Kunitou |
| 6,236,587 B1 | 5/2001 | Gudesen et al. |
| 6,380,597 B1 | 4/2002 | Gudesen et al. |
| 6,624,485 B2 | 9/2003 | Johnson |
| 6,717,222 B2 | 4/2004 | Zhang |
| 2009/0122598 A1* | 5/2009 | Toda ................... G11C 11/56 365/158 |

* cited by examiner

MULTI-BIT-PER-CELL THREE-DIMENSIONAL RESISTIVE RANDOM-ACCESS MEMORY (3D-RRAM)

CROSS-REFERENCE TO RELATED APPLICATIONS

This application is a continuation-in-part of U.S. patent application Ser. No. 16/125,714, filed Sep. 9, 2018, which is a continuation of U.S. patent application Ser. No. 15/488, 435, filed Apr. 14, 2017, now U.S. Pat. No. 10,102,917, which claims priority from Chinese Patent Application 202010052642.1, filed Jan. 16, 2020; Chinese Patent Application 201810872935.7, filed on Aug. 2, 2018; Chinese Patent Application 201610238012.7, filed on Apr. 14, 2016, in the State Intellectual Property Office of the People's Republic of China (CN), the disclosure of which is incorporated herein by reference in its entirety.

BACKGROUND

1. Technical Field of the Invention

The present invention relates to the field of integrated circuit, and more particularly to resistive random access memory (RRAM).

2. Prior Art

Three-dimensional memory (3D-M) is a monolithic semiconductor memory. It comprises a plurality of vertically stacked memory cells. In a conventional memory, the memory cells are formed on a two-dimensional (2-D) plane (i.e. on a semiconductor substrate). In contrast, the memory cells of the 3D-M are formed in a three-dimensional (3-D) space. The 3D-M has a large storage density and a low storage cost.

U.S. Pat. No. 5,835,396 issued to Zhang on Nov. 10, 1998 discloses a three-dimensional read-only memory (3D-ROM) 00. It comprises a semiconductor substrate 0 and a plurality of memory levels 100, 200 stacked above the semiconductor substrate 0. Among them, the memory level 200 is stacked above the memory level 100. Transistors in the substrate 0 and interconnects thereof form a substrate circuit (including the peripheral circuit of the memory levels 100, 200). Each memory level (e.g. 100) comprises a plurality of address lines (e.g. word lines 20a, 20b . . . , and bit lines 30a, 30b . . . ) and memory cells (e.g. 1aa-1bb . . . ). Each memory level 100 further comprises a plurality of 3D-M arrays. Each 3D-M array is a collection of memory cells which share at least one address line. Contact vias 20av, 30av couple the address lines 20a, 30a with the substrate 0.

Among various types of 3D-M, three-dimensional resistive random access memory (3D-RRAM) is attractive due to its lower programming voltage and faster read/write speed. The primary goal of the 3D-RRAM is to replace NOR FLASH for code storage and, more ambitiously, NAND FLASH as data storage. The 3D-RRAM cell is typically single-bit-per-cell, wherein each 3D-RRAM cell stores a single bit. Namely, each 3D-RRAM cell has only two states '1' and '0': the '1' cell is in a low-resistance state, whereas the '0' cell is in a high-resistance state. To further improve the storage density and lower the storage cost, it is desired to store more bits in each 3D-RRAM cell.

OBJECTS AND ADVANTAGES

It is a principle object of the present invention to provide a 3D-RRAM with a large storage capacity.

It is a further object of the present invention to provide a 3D-RRAM with a low storage cost.

It is a further object of the present invention to provide a properly working 3D-RRAM even with leaky RRAM cells.

It is a further object of the present invention to provide a properly working 3D-RRAM even under external interferences.

In accordance with these and other objects of the present invention, the present invention discloses a multi-bit-per-cell 3D-RRAM.

SUMMARY OF THE INVENTION

The present invention discloses a multi-bit-per-cell three-dimensional resistive random access memory (3D-$RRAM_{MB}$). It comprises a plurality of RRAM cells stacked above a semiconductor substrate. Each RRAM cell comprises a RRAM layer, which can be switched from a high-resistance state to a low-resistance state during programming. By adjusting the magnitude of the programming currents, the programmed RRAMs have different resistances. Using the resistance to represent the digital states, the RRAM cells have N (N>2) states: 0, 1, . . . N−1, whose respective resistances are $R_0$, $R_1$, . . . $R_{N-1}$, with $R_0 > R_1 > \ldots > R_{N-1}$. Having N states, each RRAM cell stores more than one bit.

To minimize read error due to leaky RRAM cells, the present invention discloses a full-read mode. For the full-read mode, the states of all RRAM cells on a selected word line are read out during a read cycle. The read cycle includes two read phases: a pre-charge phase and a read-out phase. During the pre-charge phase, all address lines (including all word and all bit lines) in a RRAM array are charged to an input bias voltage of an amplifier associated with the RRAM array. During the read-out phase, after its voltage is raised to the read voltage $V_R$, a selected word line starts to charge all bit lines through the associated RRAM cells. By measuring the voltage change on the bit lines, the states of the associated RRAM cells can be determined.

To minimize read error due to external interferences, the present invention further discloses a differential amplifier for measuring the states of the RRAM cells. One input of the differential amplifier is the bit-line voltage $V_b$ from a data RRAM cell (i.e. the RRAM cell that stores data), while the other input is a reference voltage $V_{ref}$ from a dummy RRAM cell (i.e. the RRAM cell that provides $V_{ref}$ for the differential amplifier). Like the data RRAM cells, the dummy RRAM cells have N states. The value of the reference voltage (e.g. $V_{ref,1}$) is between the voltages (e.g. $V_{.0'}$, $V_{.1'}$) on the bit lines associated with the dummy RRAM cells in adjacent states (e.g. '0', '1'), preferably equal to the average of the two. To determine the state of a selected data RRAM cell, N−1 measurements are taken. The data RRAM cell is in the state 'k' if $V_{ref,k-1} < V_b < V_{ref,k}$ (k=1, 2, . . . N−1).

Accordingly, the present invention discloses a multi-bit-per-cell 3D-RRAM (3D-$RRAM_{MB}$), comprising: a semiconductor substrate including transistors thereon; a plurality of RRAM cells stacked above said semiconductor substrate, each of said RRAM cells comprising a RRAM layer, where said RRAM layer is switched from a high-resistance state to a low-resistance state during programming; a plurality of contact vias coupling said RRAM cells to said semiconductor substrate; wherein said RRAM cells have more than two states, the RRAM cell in different states being programmed by different programming currents.

The present invention further discloses a multi-bit-per-cell 3D-RRAM (3D-$RRAM_{MB}$), comprising: a semiconductor substrate including transistors thereon; a plurality of RRAM cells stacked above said semiconductor substrate, each of said RRAM cells comprising a RRAM layer, where said RRAM layer is switched from a high-resistance state to a low-resistance state during programming; a plurality of contact vias coupling said RRAM cells to said semiconductor substrate; wherein the resistance of said RRAM layer is determined by a programming current, said RRAM cells being programmed by at least two programming currents.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments. In FIG. 6A, FIG. 7A, FIG. 8A and FIG. 9, solid dots represent programmed RRAM cells, while open dots represent unprogrammed RRAM cells. The symbol "/" means a relationship of "and" or "or".

Throughout the present invention, the phrase "on the substrate" means the active elements of a circuit are formed on the surface of the substrate, although the interconnects between these active elements are formed above the substrate and do not touch the substrate; the phrase "above the substrate" means the active elements are formed above the substrate and do not touch the substrate.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 1:
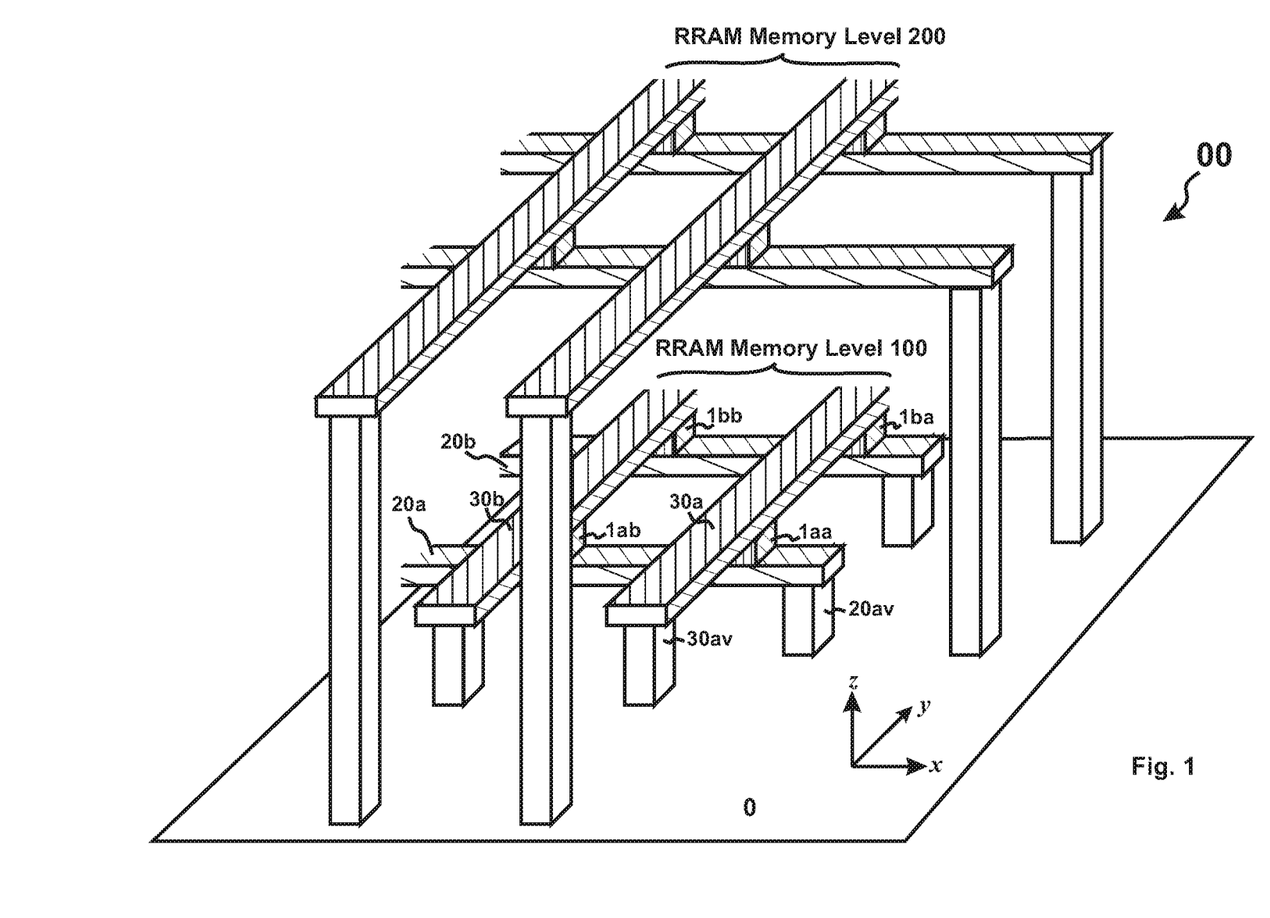
FIG. 1 is a perspective view of a 3D-RRAM.
Figure 2A:
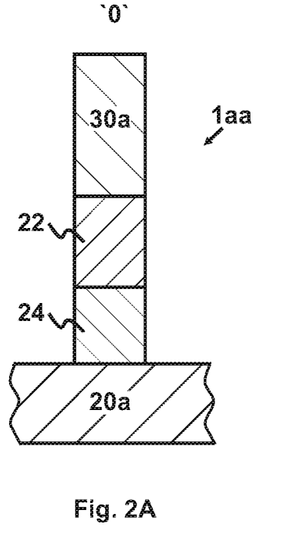
FIGS. 2A-2D are cross-sectional views of four preferred 3D-RRAM cells in different states.
Figure 2B:
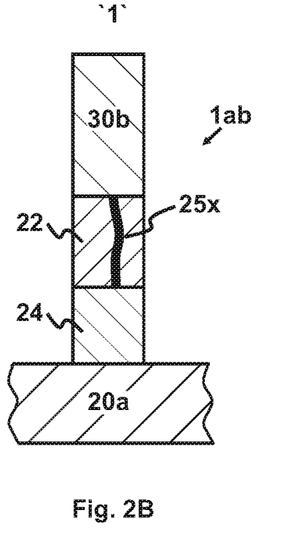
Figure 2C:
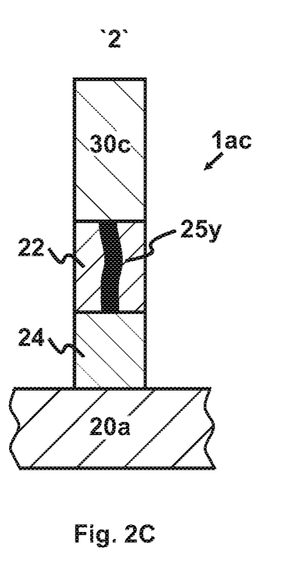
Figure 2D:
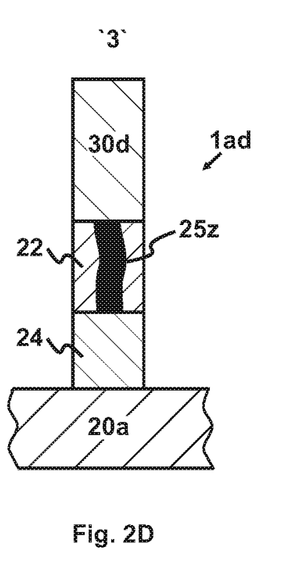

Referring now to FIG. 2A-2D, four preferred RRAM cells 1aa-1ad are disclosed. They are in the states: '0', '1', '2', '3', respectively. Each RRAM cell (e.g. 1aa) comprises a top electrode 30a, a bottom electrode 20a, a RRAM layer 22 and a quasi-conductive layer 24. The RRAM layer 22 has high resistance before programming (FIG. 2A), and is switched to low resistance after programming (FIGS. 2B-2D). The quasi-conductive layer 24 has the following properties: its resistance at the read voltage (i.e. the read resistance) is substantially lower than when the applied voltage has a magnitude smaller than or polarity opposite to that of the read voltage. The quasi-conductive layer 24 is also referred to steering element (or, layer), diode element (or, layer), selector, or other names.

Because the RRAM cell 1aa is unprogrammed, no conductive filament is formed in its RRAM layer 22. On the other hand, because the RRAM cells 1ab-1ad are programmed, conductive filaments 25x-25z of different sizes are formed therein. Among them, the conductive filament 25x of the RRAM cell 1ab is thinnest and has the largest resistance; the conductive filament 25z of the RRAM cell 1ad is thickest and has the lowest resistance; the conductive filaments 25y of the RRAM cell 1ac has an intermediate size and therefore, has an intermediate resistance.

Figure 3:
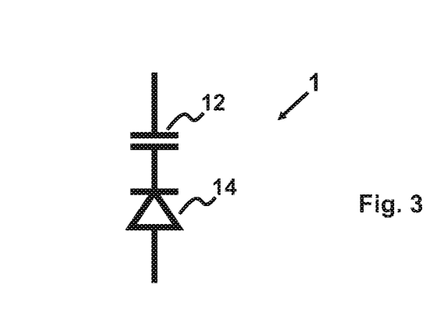
FIG. 3 is a symbol of a RRAM cell.

FIG. 3 is a symbol of a RRAM cell 1. It comprises a RRAM 12 and a diode 14. The RRAM 12 comprises the RRAM layer 22 and its resistance is switched from high to low during programming. The diode 14 comprises the quasi-conductive layer 24 and is broadly interpreted as any two-terminal device whose resistance at the read voltage is substantially lower than when the applied voltage has a magnitude smaller than or polarity opposite to that of the read voltage.

Figure 4A:
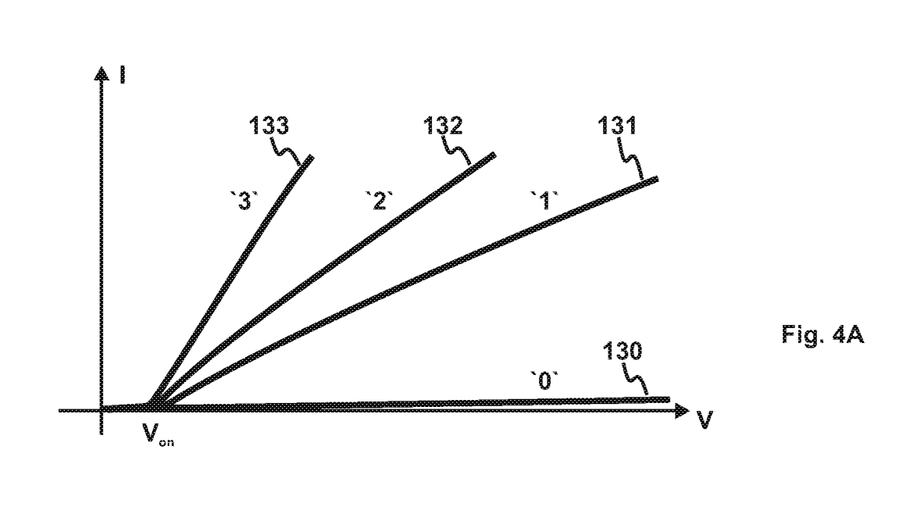
FIG. 4A shows a current-voltage (I-V) characteristics of four preferred RRAM cells in different states.
Figure 4B:
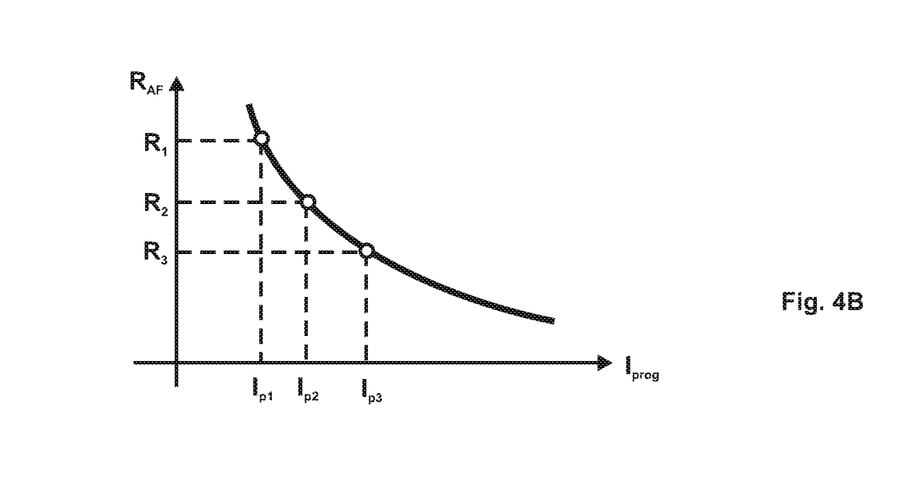
FIG. 4B shows a relationship between the resistance of the programmed RRAM and the programming current ($R_{AF}$-$I_P$).

Referring now to FIGS. 4A-4B, the electrical characteristics of the states '0'-'3' RRAM cells are disclosed. FIG. 4A shows current-voltage (I-V) characteristics of the states '0'-'3' RRAM cells. The I-V curve 130 corresponds to a state '0' RRAM cell 1aa; the I-V curve 131 corresponds to a state '1' RRAM cell 1ab; the I-V curve 132 corresponds to a state '2' RRAM cell 1ac; the I-V curve 133 corresponds to a state '3' RRAM cell 1ad. The diode 14 has a turn-on voltage $V_{on}$. Once the applied voltage is larger than $V_{on}$, the resistance of the diode 14 drops rapidly. At this time, the resistance of the RRAM cell 1 primarily comes from the RRAM layer 12.

FIG. 4B shows a relationship between the resistance of the programmed RRAM ($R_{AF}$) and the programming current ($I_P$). As $R_{AF}$ is generally inversely proportional to $I_P$, the programmed RRAM would have different $R_{AF}$ by adjusting $I_P$. For the state '1', the programming current $I_{P1}$ is relatively small, thus the RRAM resistance $R_1$ is relatively large. For the state '3', the programming current $I_{P3}$ is relatively large, thus the RRAM resistance $R_3$ is relatively small. The state '2' is between the states '1' and '3'. Overall, $I_{p1}<I_{p2}<I_{p3}$ leads to $R_1>R_2>R_3$.

Figure 5A:
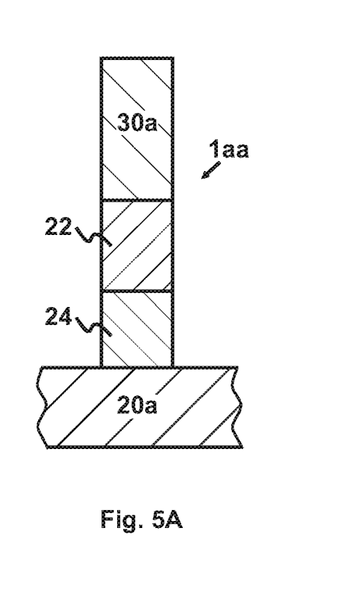
FIGS. 5A-5C are cross-sectional views of three preferred 3D-RRAM cells.
Figure 5B:
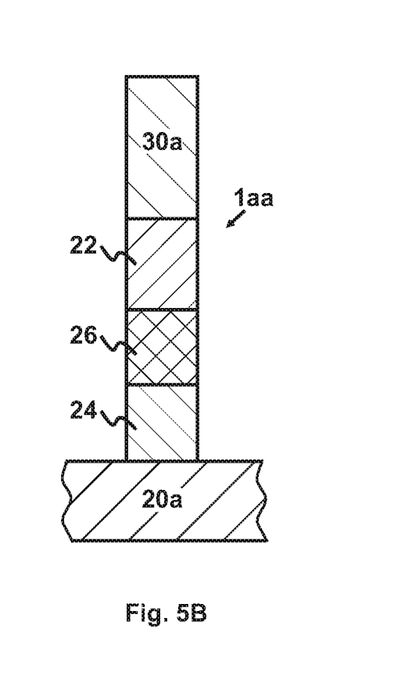
Figure 5C:
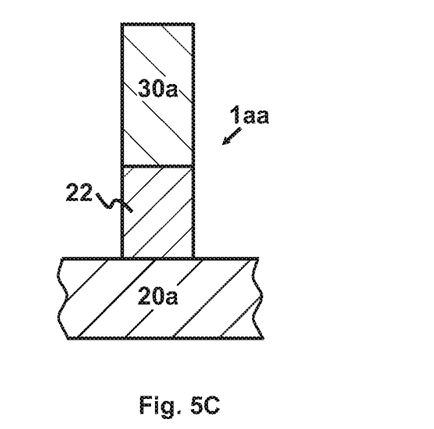

Referring now to FIGS. 5A-5C, three preferred 3D-RRAM cells 1aa are shown. In the preferred embodiment of FIG. 5A, the bottom electrode (word line) 20a comprises a metallic or highly doped semiconductor material. The top electrode (bit line) 30a comprises a metallic or highly doped semiconductor material. The RRAM layer 22 is a layer of insulating dielectric (e.g. silicon oxide, silicon nitride). The quasi-conductive layer 24 is used to form a diode 14.

For a semiconductor diode 14, the bottom electrode 20a comprises a P+ semiconductor material, the quasi-conductive layer 24 comprises an N− semiconductor material, while the top electrode 30a comprises an N+ semiconductor material. Alternatively, the bottom electrode 20a comprises a metallic material, the quasi-conductive layer 24 comprises a P+/N−/N+ diode, while the top electrode 30a comprises another metallic material. It should be apparent to those skilled in the art that other forms of the semiconductor diode can also be used.

For a Schottky diode 14, the bottom electrode 30a comprises a metallic material, the quasi-conductive layer 24 comprises an N− semiconductor material, while the top electrode 30a comprises an N+ semiconductor material. For a ceramic diode 14, the bottom electrode 30a comprises a metallic material, the quasi-conductive layer 24 comprises a ceramic material (e.g. a layer of metal oxide), while the top electrode 30a comprises another metallic material. It should be apparent to those skilled in the art that other forms of the Schottky diode can also be used.

The preferred embodiment of FIG. 5B is similar to that of FIG. 5A, except that a conductive layer 26 separates the RRAM layer 22 from the quasi-conductive layer 24. The conductive layer 26 preferably comprises at least a metallic material, which minimizes heat damage to the quasi-conductive layer 24 during programming. The preferred embodiment of FIG. 5C is even simpler than those of FIGS. 5A-5B in that it does not comprise a separate quasi-conductive layer. After the RRAM layer 22 is ruptured, a diode is naturally formed at the junction of the top electrode 30a and the bottom electrode 20a. As an example, the bottom electrode 20a comprises a highly doped P+ semiconductor material and the top electrode 20a comprises a highly doped N+ semiconductor material. For those skilled in the art, the RRAM cell 1aa could take other forms.

Figure 6A:
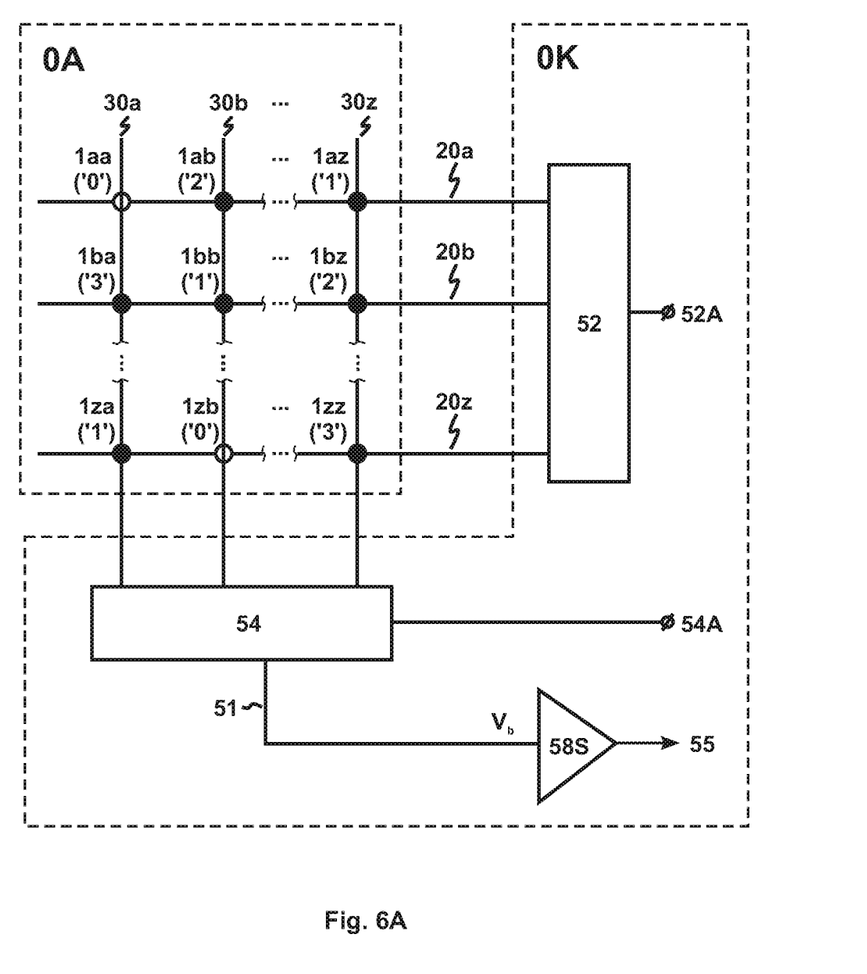
FIG. 6A is a circuit block diagram of a preferred RRAM array in the full-read mode.
Figure 6B:
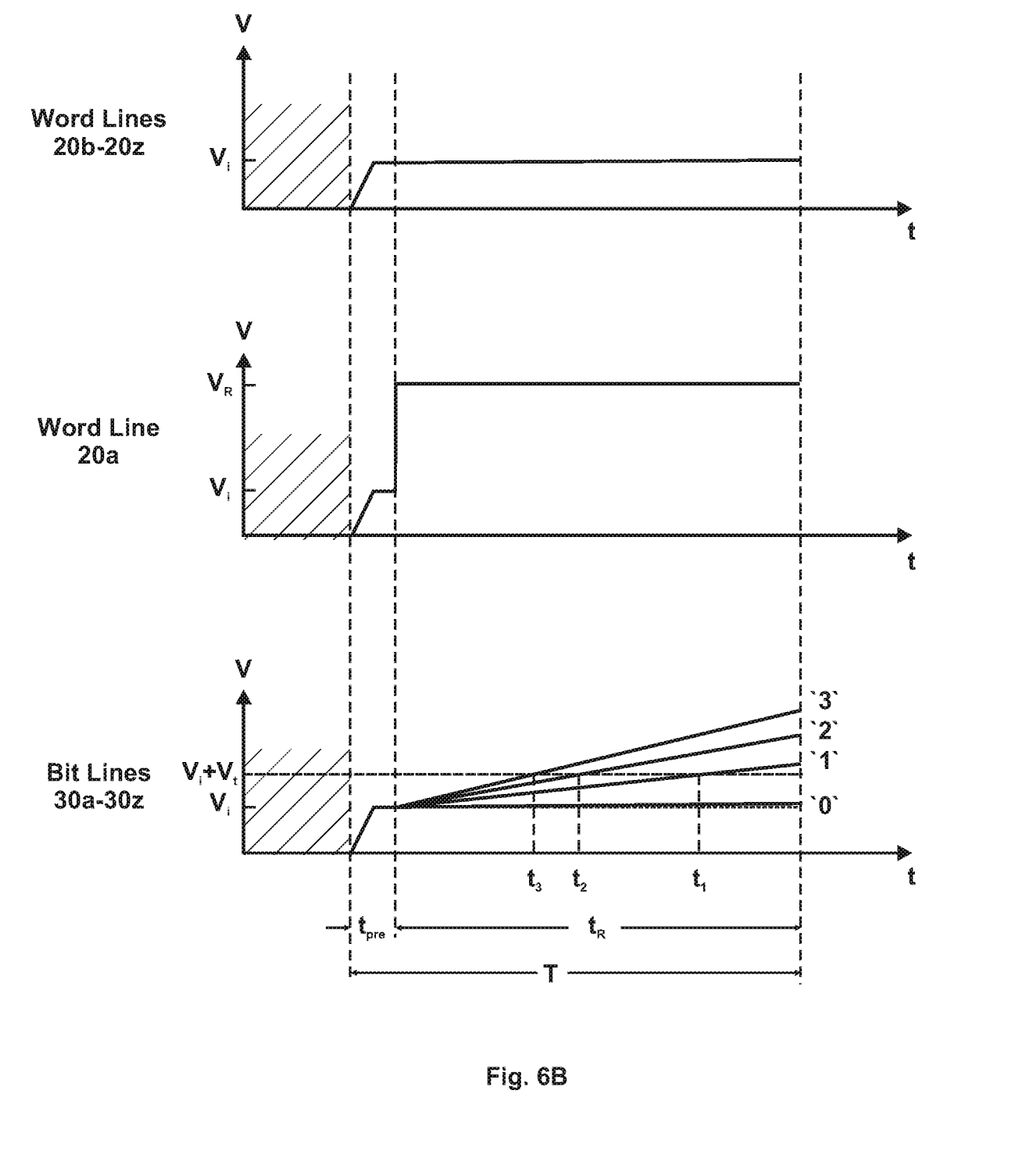
FIG. 6B is its signal timing diagram.

To minimize read error due to leaky RRAM cells, the present invention discloses a full-read mode. For the full-read mode, all RRAM cells on a selected word line are read out during a read cycle T. FIGS. 6A-6B discloses a preferred RRAM array 0A in the full-read mode. The RRAM array 0A comprises word lines 20a-20z, bit lines 30a-30z and RRAM cells 1aa-1zz (the numbers in the parenthesis represent the states of the RRAM cells) (FIG. 6A). The preferred embodiment further comprises a single-ended amplifier 58S. The read cycle T includes two read phases: a pre-charge phase $t_{pre}$ and a read-out phase $t_R$ (FIG. 6B). During the pre-charge phase $t_{pre}$, all address lines 20a-20z, 30a-30z in the RRAM array 0A are charged to an input bias voltage $V_i$ of the amplifier 58S.

During the read-out phase $t_R$, all bit lines 30a-30z are floating. Based on the row address 52A, the row decoder 52 raises the voltage on a selected word line 20a to the read voltage $V_R$, while voltage on unselected word lines 20b-20z remains at the input bias voltage $V_i$. After this, the selected word line 20a starts to charge the bit lines 30a-30z through the RRAM cells 1aa-1az and the voltages on the bit lines 30a-30z begin to rise. At this time, the voltage on each bit line is sent to the amplifier 58S by rotating the column address 54A. For each column address 54A, the column decoder 54 selects a bit line (e.g. 30b) and sends its voltage $V_b$ to the input 51 of the amplifier 58S. When the value of the voltage $V_b$ exceeds the threshold voltage $V_T$ of the amplifier 58S, the output 55 is toggled. By measuring the toggling time, the state of each RRAM cell (e.g. the RRAM cell 1ab at the intersection of the selected word line 20a and the selected bit line 30b) can be determined.

During the above measurement, because the $V_T$ of the amplifier 58S is relatively small (~0.1V or smaller), the voltage changes delta(V) on the bit lines 30a-30z are small. The largest voltage change $delta(V)_{max}$~$N*V_T$ is far less than the read voltage $V_R$. As long as the I-V characteristics of the RRAM cell satisfies $I(V_R) \gg I(-N*V_T)$, the 3D-RRAM$_{MB}$ would work properly even with leaky RRAM cells.

Figure 7A:
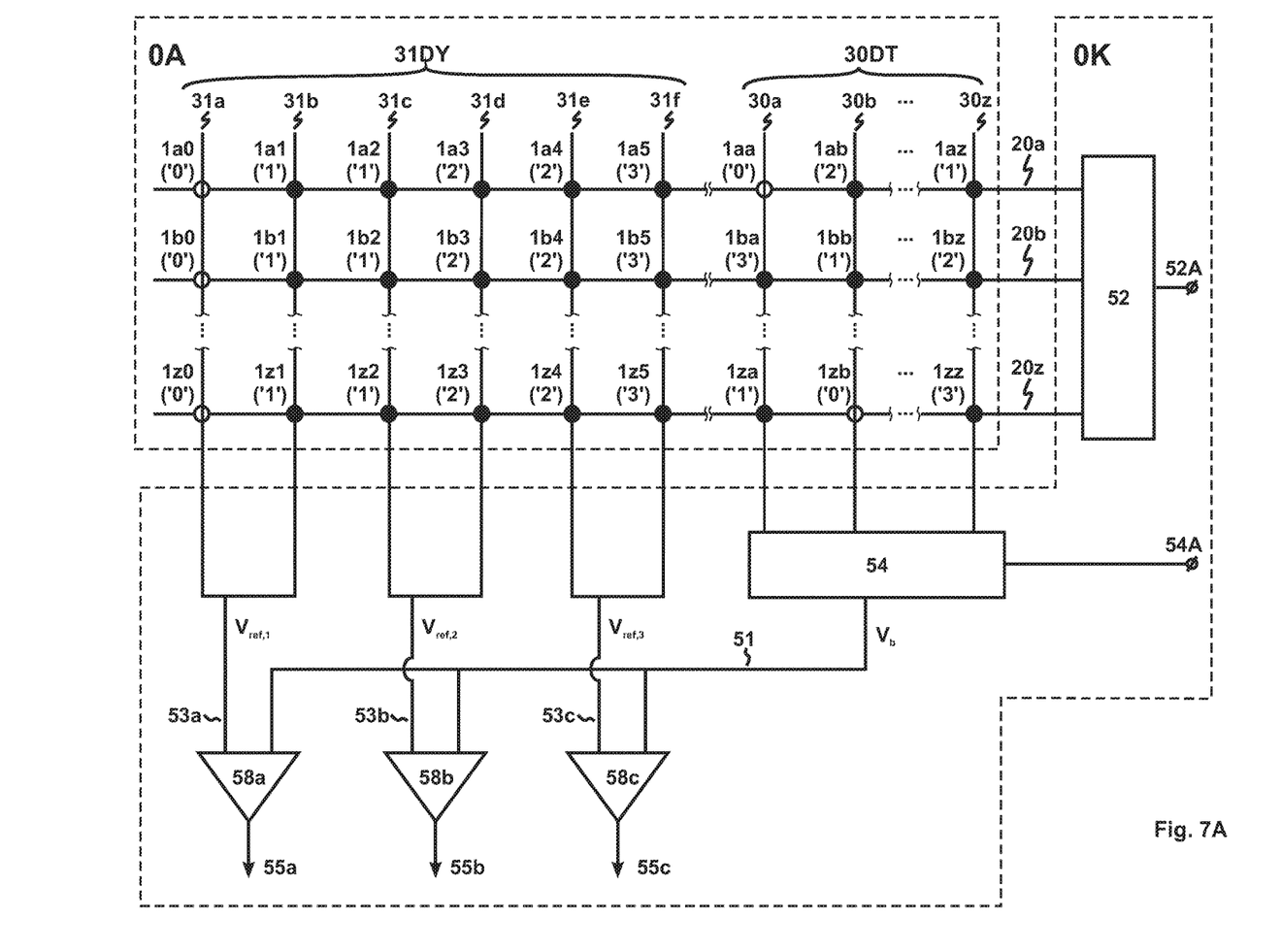
FIG. 7A is a circuit block diagram of a first preferred RRAM array comprising differential amplifiers.
Figure 7B:
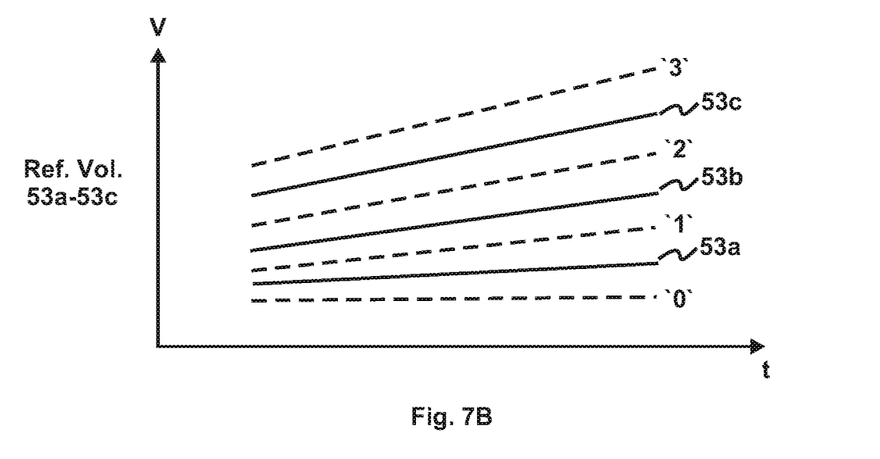
FIGS. 7B-7C are the signal timing diagrams for the reference voltages and the bit-line voltages, respectively.
Figure 7C:
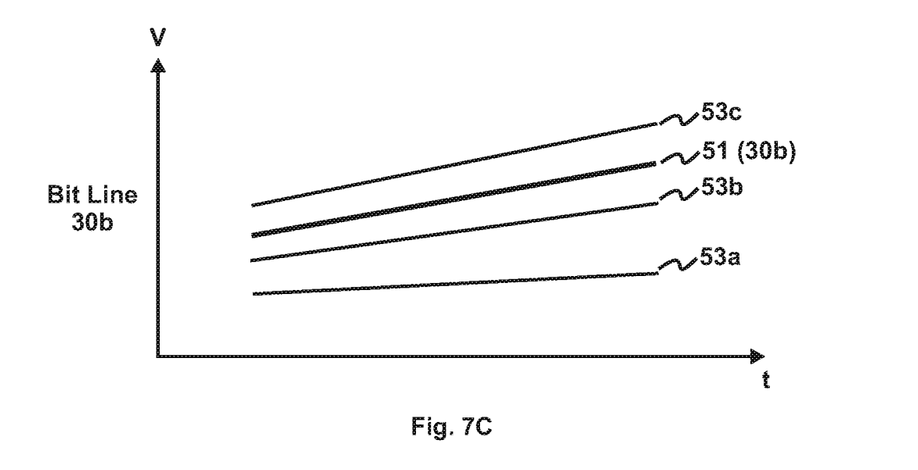

To minimize read error due to external interferences, the present invention further discloses differential amplifiers for measuring the states of the RRAM cells. FIGS. 7A-C disclose a first preferred RRAM array 0A with differential amplifiers. In addition to the regular bit line 30a-30z and RRAM cells 1aa-1zz (FIG. 6A), the preferred RRAM array 0A further comprises dummy bit lines 31a-31f and dummy RRAM cells 1a0-1z5 (FIG. 7A). For clarity, the regular bit line 30a-30z are referred to as data bit lines, while the regular RRAM cells 1aa-1zz are referred to as data RRAM cells. The dummy bit lines 31a-31f form a dummy bit-line set 30DY, while the data bit lines 30a-30z form a data bit-line set 30DT.

This preferred embodiment further comprises N−1 (in this case, =3) differential amplifiers 58a-58c (FIG. 7A). All differential amplifiers 58a-58c comprise two inputs: first inputs are the bit-line voltage $V_b$ from a data RRAM cell (i.e. the RRAM cell stores data), while second inputs are the reference voltages $V_{ref,1}$-$V_{ref,3}$. For example, the reference voltage for the differential amplifier 58a is $V_{ref,1}$~$(V_{·0·}+V_{·1·})/2$; the reference voltage for the differential amplifier 58b is $V_{ref,2}$~$(V_{·1·}+V_{·2·})/2$; and, the reference voltage for the differential amplifier 58c is $V_{ref,3}$~$(V_{·2·}+V_{·3·})/2$. As used herein, $V_{·i·}$ (i=0, 1, 2, or 3) is the voltage on the associated bit line when reading out a state 'I' RRAM cell.

To generate these reference voltages $V_{ref,1}$-$V_{ref,3}$, the RRAM array 0A uses 2N−2 (in this case, =6) dummy bit lines 31a-31f. Each word line (e.g. 20a) is associated with 2N−2 (in this case, =6) dummy RRAM cells (e.g. 1a0-1a5). Like the data RRAM cells 1aa-1az, the dummy RRAM cells 1a0-1a5 have N states. For example, the dummy RRAM cells 1aa0-1a5 on the word line 20a are in the states '0', '1', '1', '2', '2', '3', '3', respectively (FIG. 7A). The reference voltage $V_{ref,1}$ on the second input 53a of the amplifier 58a is generated by shorting the dummy bit lines 31a (coupled with a '0' dummy RRAM cell 1a0) and 31b (coupled with a '1' dummy RRAM cell 1a1). Namely, $V_{ref,1}=(V_{31a}+V_{31b})/2=(V_{·0·}+V_{·1·})/2$ (FIG. 7B). The reference voltage $V_{ref,2}$ on the second input 53b of the amplifier 58b is generated by shorting the dummy bit lines 31c (coupled with a '1' dummy RRAM cell 1a2) and 31d (coupled with a '2' dummy RRAM cell 1a3). Namely, $V_{ref,2}=(V_{31c}+V_{31d})/2=(V_{·1·}+V_{·2·})/2$. The reference voltage $V_{ref,3}$ on the second input 53c of the amplifier 58c is generated by shorting the dummy bit lines 31e (coupled with a '2' dummy RRAM cell 1a4) and 31f (coupled with a '3' dummy RRAM cell 1a5). Namely, $V_{ref,3}=(V_{31e}+V_{31f})/2=(V_{·2·}+V_{·3·})/2$.

To determine the state of a selected data RRAM cell, N−1 measurements are taken concurrently at the N−1 amplifiers 58a-58c. The data RRAM cell is in the state 'k' if $V_{ref,k-1}<V_b<V_{ref,k}$ (k=1, 2, ... N−1). For example, to measure the state of the data RRAM cell 1ab, the column decoder 54 sends the voltage on the bit line 30b to the first inputs of all amplifiers 58a-58c. The amplifiers 58a-58c make three measurements concurrently (FIG. 7C). As the data RRAM cell 1ab is in the state '2', the bit-line voltage $V_b$ on the first input 51 is larger than the reference voltages $V_{ref,1}$, $V_{ref,2}$ on the second inputs 53a, 53b of the amplifiers 58a, 58b, respectively. However, $V_b$ is smaller than $V_{ref,3}$ on the second input 53c of the amplifier 58c. Thus, the outputs 55a-55c of the amplifiers 58a-58c are high, high, low. Accordingly, the state of the data RRAM cell 1ab can be determined.

Figure 8A:
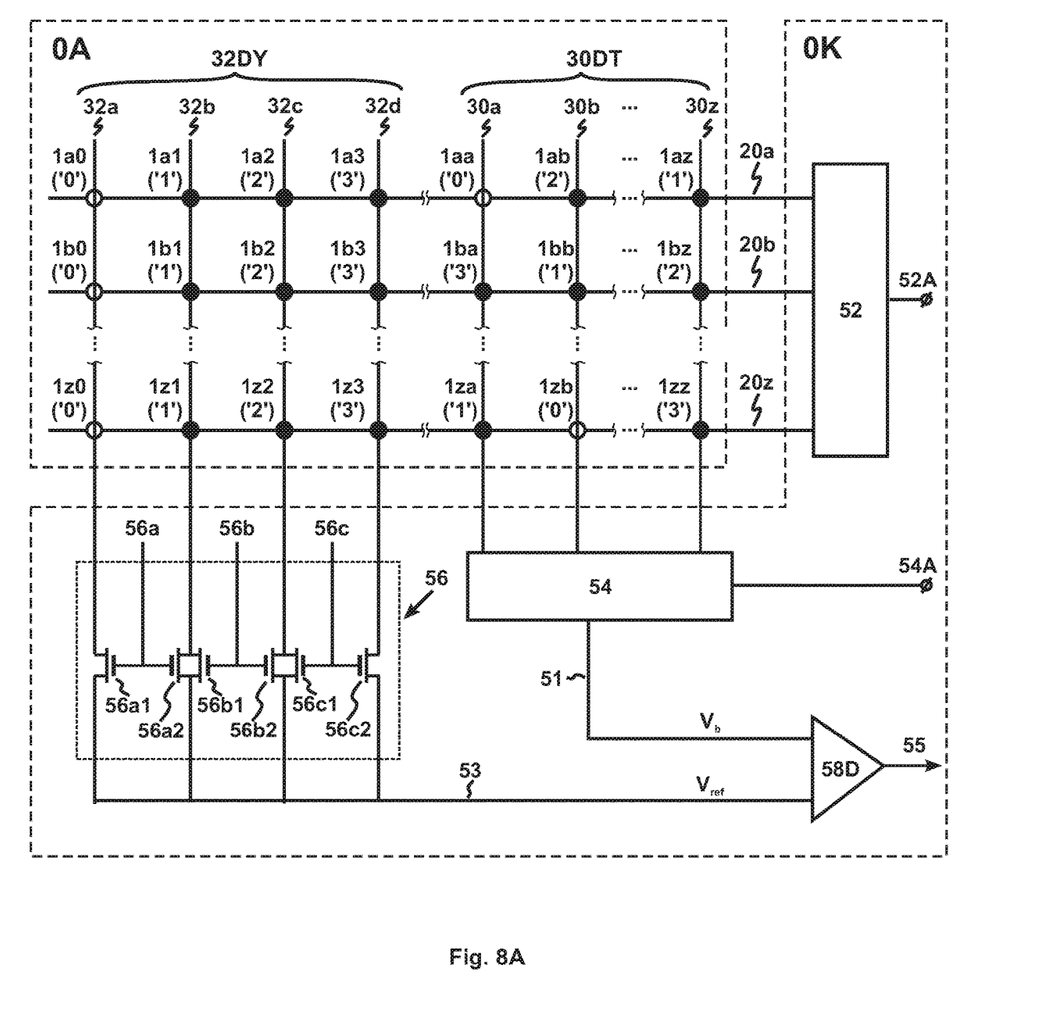
FIG. 8A is a circuit block diagram of a second preferred RRAM array comprising a differential amplifier.
Figure 8B:
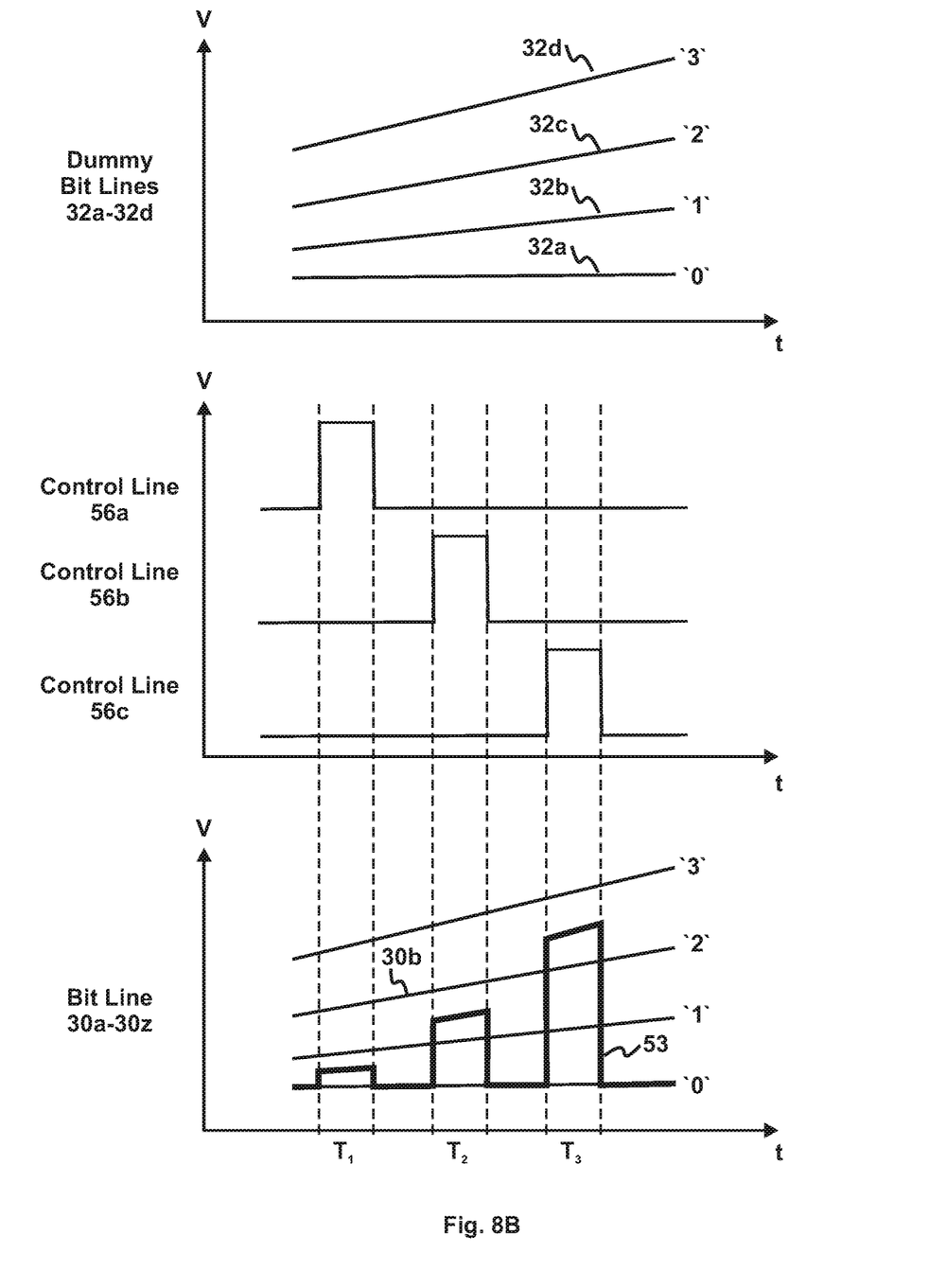
FIG. 8B is its signal timing diagram.

FIGS. 8A-8B discloses a second preferred RRAM array 0A comprising an amplifier. Instead of three amplifiers 58a-58c (FIG. 7A), it uses a single amplifier 58D (FIG. 8A). The first input of the amplifier 58D is the bit-line voltage $V_b$ of a selected data RRAM cell, while the second input is a selected reference voltage $V_{ref}$. This preferred embodiment uses fewer dummy bit lines and dummy RRAM cells than FIG. 7A. The RRAM array 0A comprises only N (in this case, =4) dummy bit lines 32a-32d and each word line (e.g. 20a) is coupled with N dummy RRAM cells (e.g. 1a0-1a3). Like the data RRAM cells 1aa-1az, the dummy RRAM cells 1a0-1a3 have N states. For example, the dummy RRAM cells 1aa0-1a3 on the word line 20a are in the states '0', '1', '2', '3', respectively (FIG. 8A). Adjacent dummy bit lines (e.g. 32a, 32b) are coupled through a pair of pass transistors (e.g. 56a1, 56a2), which is controlled by a control signal 56a. An appropriate reference voltage $V_{ref}$ is generated by asserting the corresponding control signals. For example, by asserting the control signal 56a, the passing transistors 56a1, 56a2 is turned on and the reference voltage $V_{ref}$ is equal to the average of the voltages on the dummy bit lines 32a, 32b. Namely, $V_{ref}=V_{32a}+V_{32b}=(V_{\cdot 0}+V_{\cdot 1})/2$.

To determine the state of a selected data RRAM cell, N−1 measurements are taken sequentially at the amplifier 58D (FIG. 8B). The RRAM cell is in the state 'k' if $V_{ref,k-1}<V_b<V_{ref,k}$ (k=1, 2, . . . N−1). For example, to determine the state of the data RRAM cell 1ab, the column decoder 54 sends the voltage $V_b$ $(=V_{\cdot 2})$ on the bit line 30b to the first input 51 of the amplifier 58D. Three sequential measurements are taken. During the first measurement $T_1$, the control signal 56a is asserted to turn on the pass transistors 56a1, 56a2. The reference voltage $V_{ref}$ on the second input 53 of the amplifier 58D is $V_{ref}=(V_{\cdot 0}+V_{\cdot 1})/2$. As $V_{ref}<V_b$, the output 55 of the amplifier 58D is high. Similarly, during the second measurement $T_2$, by turning on the pass transistors 56b1, 56b2, the output 55 of the amplifier 58D stays high as $V_{ref}=(V_{\cdot 1}+V_{\cdot 2})/2<V_b$; during the third measurement $T_3$, by turning on the pass transistors 56c1, 56c2, the output 55 of the amplifier 58D turns low as $V_{ref}=(V_{\cdot 2}+V_{\cdot 3})/2>V_b$. By analyzing the results from three measurements $T_1$-$T_3$, the state of the data RRAM cell 1ab can be determined.

In the preferred embodiments of FIGS. 6A-8B, the row decoder 52, the column decoder 54 and the amplifier 58S, 58a-58c, 58D are formed on the substrate 0 and are a portion of the substrate circuit 0K. The RRAM array 0A is stacked above the substrate circuit 0K and covers at least a portion thereof. The 3D-RRAM$_{MB}$ has a small die size and a low die cost.

Figure 9:
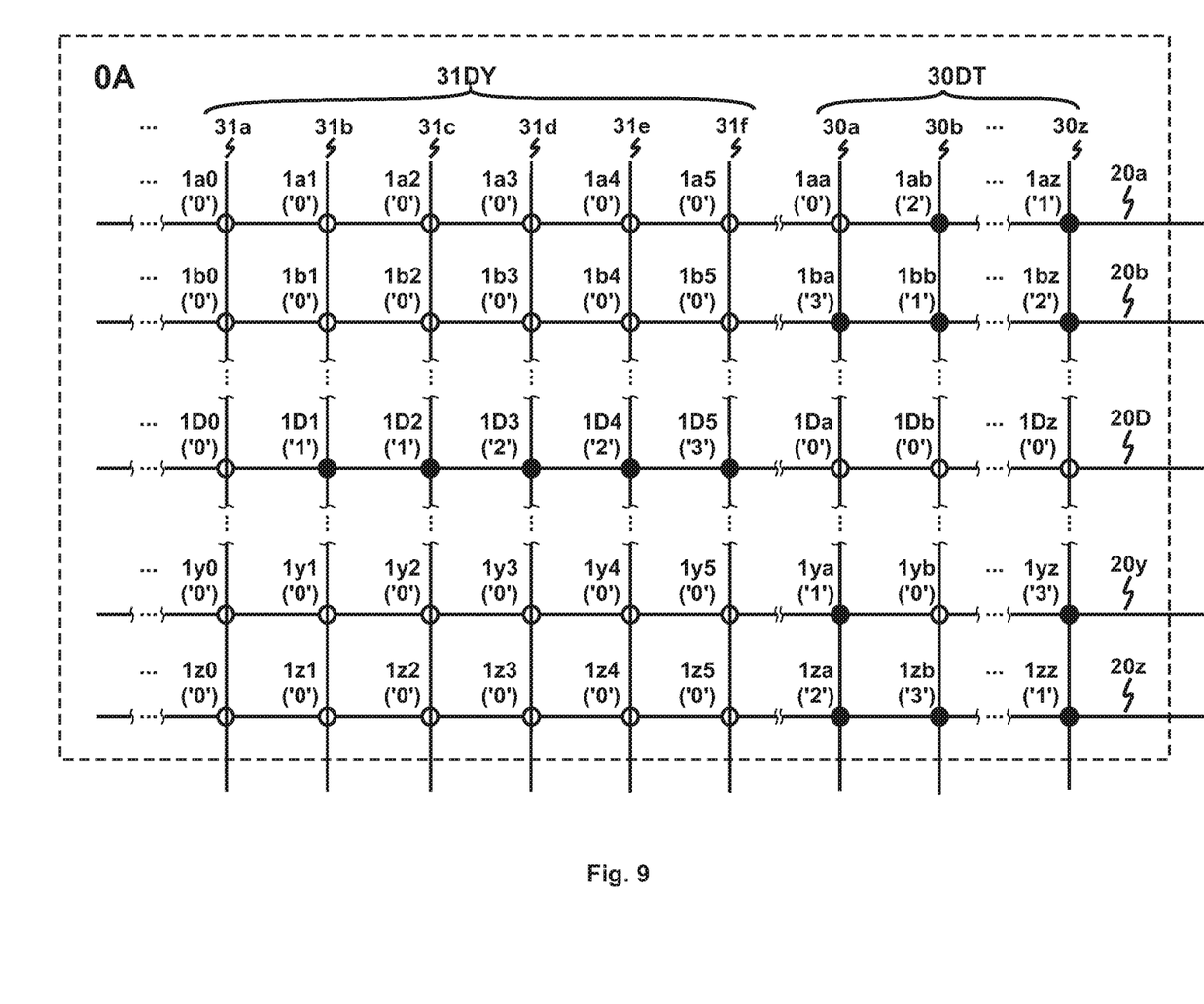
FIG. 9 is a preferred 3D-RRAM comprising a dummy word line.

All dummy RRAM cells need to be pre-programmed before shipping. During pre-programming, the resistances of the dummy RRAM cells need to be adjusted precisely. For the preferred embodiment of FIG. 7A (or, FIG. 8A), each word line 20a is associated with 2N−2 (or, N) dummy RRAM cells. The total number of the dummy RRAM cells in the RRAM array 0A (with M data word lines and N data bit lines) is (2N−2)*M (or, N*M). Pre-programming all of them is time consuming and costly. To reduce the pre-programming time, the present invention further discloses a dummy word line. FIG. 9 discloses a preferred RRAM array 0A comprising a dummy word line 20D. In addition to the data word lines 20a, 20b, . . . 20y, 20z, the preferred RRAM array 0A comprises a dummy word line 20D. The pre-programming is only carried out to the dummy RRAM cells 1D1-1D5 located at the intersections of the dummy word line 20D and the dummy bit lines 31b-31f. Because majority of the dummy RRAM cells (e.g. 1a0-1b5, 1y0-1z5) do not need pre-programming, the pre-programming time is significantly reduced.

During read, both voltages on the selected data word line (e.g. 20a) and the dummy word line 20D are raised to $V_R$.

Because the dummy RRAM cells 1Da-1Dz at the intersections of the dummy word line 20D and the data bit lines 30a-30z are un-programmed, the voltage rise on the dummy word line 20D would not affect the signals on the data bit lines 30a-30z. Moreover, because the dummy RRAM cells 1a0-1a5 at the intersections of the data word line 20a and the dummy bit lines 31a-31f are un-programmed, the voltage rise on the data word line 20a would not affect the signals on the dummy bit lines 31a-31f, either. Accordingly, the operation of this preferred embodiment is similar to those in FIGS. 7A-8B.

In the preferred embodiments of FIGS. 7A-9, to manufacture high-quality dummy RRAM cells, all dummy word line, dummy bit lines and dummy RRAM cells are preferably formed in the middle of the RRAM array 0A. For example, the dummy word line 20D is formed in the middle of the RRAM array 0A, so are the dummy bit lines 31a-31f.

Although examples disclosed in these figures are horizontal 3D-RRAM (i.e. the RRAM memory levels 100, 200 are horizontal), the inventive spirit can be extended to vertical 3D-RRAM (i.e. the RRAM memory strings are vertical to the substrate).

While illustrative embodiments have been shown and described, it would be apparent to those skilled in the art that many more modifications than that have been mentioned above are possible without departing from the inventive concepts set forth therein. For example, beside N=4 (i.e. each RRAM cell stores two bits), the present invention can be extended to N=8 (i.e. each RRAM cell stores three bits) or more. The invention, therefore, is not to be limited except in the spirit of the appended claims.

What is claimed is:

1. A multi-bit-per-cell three-dimensional resistive random-access memory (3D-RRAM$_{MB}$), comprising:
   a semiconductor substrate including transistors thereon;
   a RRAM array stacked above said semiconductor substrate, said RRAM array comprising a plurality of RRAM cells, a plurality of word lines including a data word line, and a plurality of bit lines including a data bit line;
   a dummy word line in parallel with said data word line;
   a dummy bit line in parallel with said data bit line;
   a first dummy RRAM cell disposed at the intersection of said dummy word line and said dummy bit line;
   a second dummy RRAM cell disposed at the intersection of said data word line and said dummy bit line, wherein said second dummy RRAM cell is unprogrammed;
   a third dummy RRAM cell disposed at the intersection of said dummy word line and said data bit line, wherein said third dummy RRAM cell is unprogrammed
   a plurality of contact vias coupling said RRAM cells to said semiconductor substrate;
   wherein said RRAM cells have N states with N>2, the RRAM cell in different states being programmed by different programming currents.

2. The 3D-RRAM$_{MB}$ according to claim 1, wherein said RRAM array comprises 2N−2 dummy bit lines.

3. The 3D-RRAM$_{MB}$ according to claim 1, wherein said RRAM array comprises N dummy bit lines.

4. The 3D-RRAM$_{MB}$ according to claim 1, wherein all dummy RRAM cells at the intersections of said data word lines and all dummy bit lines in said RRAM array are unprogrammed.

5. The 3D-RRAM$_{MB}$ according to claim 1, wherein all dummy RRAM cells at the intersections of said dummy word lines and all data bit lines in said RRAM array are unprogrammed.

6. The 3D-RRAM$_{MB}$ according to claim 1, wherein both voltages on said dummy word line and said data word line are raised during read.

\* \* \* \* \*